United States Patent
Kato et al.

(10) Patent No.: US 6,483,316 B2
(45) Date of Patent: Nov. 19, 2002

(54) METHOD OF DIAGNOSING PARTIAL DISCHARGE IN GAS-INSULATED APPARATUS AND PARTIAL DISCHARGE DIAGNOSING SYSTEM FOR CARRYING OUT THE SAME

(75) Inventors: Tatsuro Kato; Fumihiro Endo, both of Hitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/917,814

(22) Filed: Jul. 31, 2001

(65) Prior Publication Data

US 2001/0040459 A1 Nov. 15, 2001

Related U.S. Application Data

(63) Continuation of application No. 09/490,279, filed on Jan. 24, 2000, now Pat. No. 6,300,768.

(30) Foreign Application Priority Data

Jan. 28, 1999 (JP) .......................................... 11-020449

(51) Int. Cl.⁷ ........................ G01R 31/08; G01R 31/00; H01H 31/02
(52) U.S. Cl. ........................ 324/536; 324/535; 324/537; 324/122
(58) Field of Search ................................ 324/600, 551, 324/536, 424, 535, 537, 122; 340/644; 702/38; 361/113

(56) References Cited

U.S. PATENT DOCUMENTS

| | | | |
|---|---|---|---|
| 3,430,186 A | 2/1969 | Brustle et al. | 324/535 |
| 3,869,665 A | 3/1975 | Kenmochi et al. | 324/72 |
| 4,385,271 A | 5/1983 | Kurtz et al. | 324/537 |
| 4,882,682 A | 11/1989 | Takasuka et al. | 702/38 |
| 4,975,800 A | 12/1990 | Oshita et al. | 361/113 |
| 5,146,170 A | 9/1992 | Ishikawa et al. | 324/536 |
| 5,200,737 A | 4/1993 | Konishi et al. | 340/644 |
| 5,396,180 A | 3/1995 | Hampton et al. | 324/551 |
| 5,854,993 A | 12/1998 | Grichnik | 702/54 |

FOREIGN PATENT DOCUMENTS

| | | |
|---|---|---|
| JP | 7-262866 | 3/1994 |
| JP | 7-50147 B | 5/1995 |

*Primary Examiner*—N. Le
*Assistant Examiner*—Wasseem H. Hamdan
(74) *Attorney, Agent, or Firm*—Mattingly, Stanger & Malur, P.C.

(57) ABSTRACT

The present invention provides a method of diagnosing a partial discharge in a gas-insulated apparatus and a partial discharge diagnosing system for carrying out the same to achieve highly accurate diagnosis through the detection of a partial discharge signal and diagnosing the partial discharge signal through multiple conditional branching. The partial discharge diagnosing system of the present invention consists: a partial discharge signal detector for detecting a partial discharge signal representing a partial discharge produced in the gas-insulated apparatus, a signal analyzer for receiving the partial discharge signal detected by the partial discharge detector and analyzing the partial discharge signal, a diagnostic unit for determining a cause of the partial discharge on the basis of results of analysis made by the signal analyzer, and a display unit for displaying results of diagnosis. The diagnostic unit is provided with a diagnostic means to make multiple conditional branching to a plurality of second diagnostic apparatus according to result of diagnosis made by a first diagnostic apparatus, and obtains a result of diagnosis made by the second diagnostic apparatus, thereby achieving highly accurate diagnosis by detecting the partial discharge signal and subjecting the partial discharge signal to multiple conditional branching.

21 Claims, 9 Drawing Sheets

F I G. 3
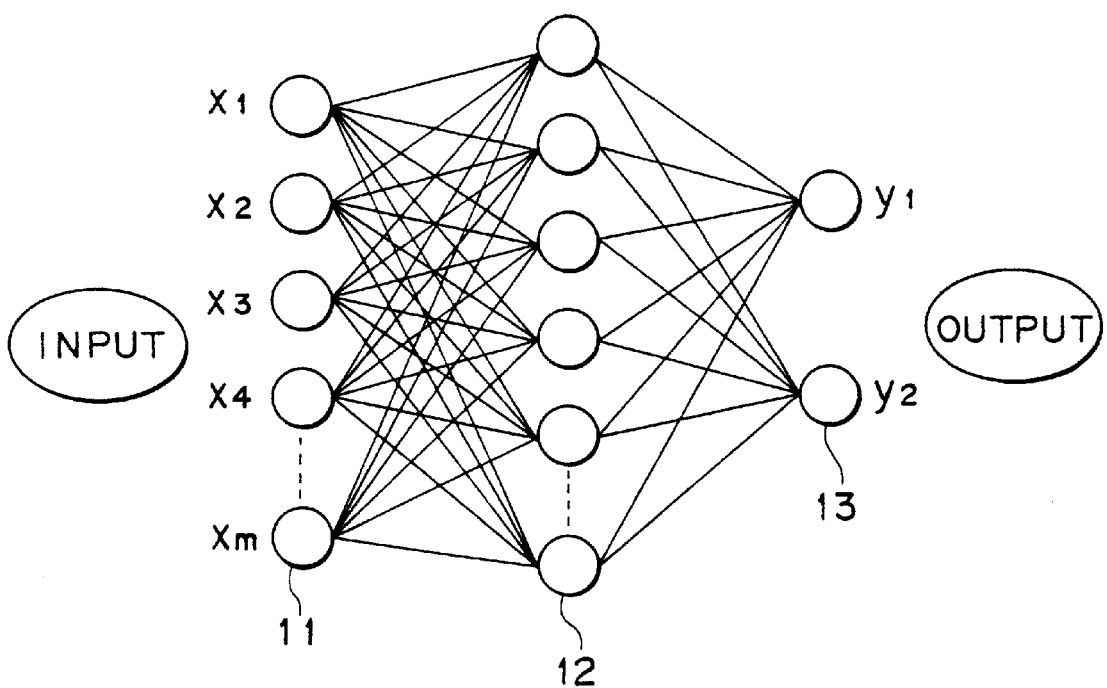

METHOD OF DIAGNOSING PARTIAL DISCHARGE IN GAS-INSULATED APPARATUS AND PARTIAL DISCHARGE DIAGNOSING SYSTEM FOR CARRYING OUT THE SAME

This application is a continuation application of U.S. Ser. No. 09/490,279, filed Jan. 24, 2000, which is U.S. Pat. No. 6,300,768.

BACKGROUND OF THE INVENTION

1. Field of the Invention

The present invention relates to a method of diagnosing a partial discharge in a gas-insulated apparatus and a partial discharge diagnosing system for carrying out the same. More particularly, the present invention relates to a method of diagnosing a partial discharge in a gas-insulated apparatus by detecting a partial discharge signal, and subjecting the partial discharge signal to multiple stages of conditional branching for diagnosis, and a partial discharge diagnosing system for carrying out the method.

2. Description of the Related Art

A gas-insulted apparatus, such as a gas-insulated switchgear installed in a substation, produces a partial discharge when an abnormal insulation condition arises in the apparatus. The partial discharge generates electromagnetic waves therewith. The partial discharge, which can be regarded as a precursory indication of an accidental electric breakdown, must accurately be detected and diagnosis must be made on the partial discharge to decide whether or not there is any abnormal insulation condition to prevent the accidental electric breakdown of the gas-insulated apparatus.

Causes of abnormal insulation include the entrance of metallic foreign matters into the gas-insulated apparatus, defects in insulators, such as voids or cracks in spacers, faulty contact in conductors of shielding members and or the like.

If the partial discharge due to those causes of abnormal insulation progresses, the insulator is progressively deteriorated and there is the possibility that electric breakdown will occur when an overvoltage, such as a lightning, is applied to the gas-insulated apparatus. Therefore, a part where the partial discharge occurred, the level of the partial discharge must accurately be determined and the part where the partial discharge occurred must be inspected and repaired depending on the part and the level of the partial discharge occurred.

Detection of the partial discharge can be performed through the detection of an electromagnetic wave, a high-frequency current, a vibration or a sound that is generated along with the partial discharge, or through the analysis of a gas that is produced by the partial discharge.

A partial discharge that is produced in $SF_6$ gas contained in the gas-insulated apparatus exhibits a very sharp pulse discharge having a pulse width in the range of several nanoseconds to several tens nanoseconds. The electromagnetic wave generated along with the partial discharge has a frequency in a wide frequency band up to several gigahertz.

The gas-insulated apparatus is constructed by sealing components in a metal container and, similar to a waveguide, propagates electromagnetic waves efficiently. Since the components of the gas-insulated apparatus are contained in the metal container, it is relatively difficult for external electromagnetic noise to reach the component parts. Accordingly, electromagnetic waves generated along with the partial discharge can be detected in a high sensitivity by disposing an internal antenna in the metal container. A previously proposed method of finding a part where a partial discharge occurred receives electromagnetic waves of frequencies with a wide frequency band of several megahertz to several gigahertz by an internal antenna and analyzes the frequency of the electromagnetic waves by a spectrum analyzer or the like.

Another previously proposed diagnostic method receives an electromagnetic wave of a specific frequency that is not affected by external noise or electromagnetic waves of frequencies with a narrow frequency band, instead of receiving all the electromagnetic waves of frequencies in a wide frequency band.

As mentioned in JP-B No. Hei 7-50147, there have been proposed a method that analyzes detected electromagnetic waves for frequency and decides whether or not any abnormal condition has occurred on the basis of the levels of frequency of the electromagnetic waves, and a method that decides whether or not any abnormal condition has occurred on the basis of feature values computed from the patterns of waveforms. A known deciding means achieves pattern recognition by using a neural network or a fuzzy system.

For example, in a system employing a neural network, the neural network comprises an input layer, an intermediate layer and an output layer, a plurality of frequency data are given to the input layer, and diagnostic results are provided on the output layer.

It is difficult, however, for the known diagnostic method which detects electromagnetic waves generated by a partial discharge and diagnosis an abnormal insulating condition in the gas-insulated apparatus to accurately determine the occurrence of the partial discharge and the causes of the partial discharge.

The known method of detecting a partial discharge signal decides that a partial discharge has occurred when a signal of a level not lower than a predetermined level, having a frequency in a reference frequency band for decision is generated. It is difficult for this method to discriminate clearly a partial discharge signal from an external noise signal. If the external noise signal is produced steadily, such as a broadcast wave, the external noise signal is measured beforehand, and signals of frequencies outside a frequency band including the frequency of the external noise signal are measured or the external noise signal is removed by a noise signal removing process. However, if the external noise signal is generated unsteadily, such as a communication signal transmitted by a mobile telephone, noise from devices or an aerial corona noise, it is difficult to discriminate a partial discharge signal generated by an internal partial discharge from the external noise.

When the partial discharge signal is detected by an antenna disposed in the gas-insulated apparatus, the frequency characteristic of the partial discharge signal detected by the antenna is affected by the frequency characteristic of a sensor including the antenna, and the frequency characteristic of an electromagnetic wave propagating passage determined by the shape and construction of a tank included in the gas-insulated apparatus. Consequently, it is difficult to accurately determine whether the signal detected by the antenna is a partial discharge signal generated internally or externally, and specialist's diagnosis is necessary for the decision.

When the diagnostic method using a neural network or a fuzzy system for a general pattern recognizing method as a diagnostic algorithm, a mass of data is obtained from the detection signal, an excessively long learning time is required and learning does not converge. Besides, it is difficult to diagnose the cause of the partial discharge and to find a part where the partial discharge was produced, even if the learning converges because there are many types of partial discharge.

The neural network structure employed in the known back propagation method makes diagnosis immediately upon the reception of analytic data and provides results of analysis. However, since the input layer 41 and the output layer 43 each has a large number of nodes, making the internal configuration of the neural network structure complicated, there rise problems such that the convergence of the learning of known data is difficult, local minimum is liable to occur and an enormously long learning time is necessary. Furthermore, it is difficult to achieve diagnosis with a practically acceptable accuracy.

The present invention has been made in view of the foregoing problems and it is therefore an object of the present invention to provide a diagnostic system capable of detecting a partial discharge signal acting as a precursory signal indicating an accidental electric breakdown in a gas-insulated apparatus and of achieving accurate diagnosis through multiple conditional branching of the partial discharge signal, and a partial discharge diagnosing method to be carried out therein.

SUMMARY OF THE INVENTION

The present invention employs the following means to solve the foregoing problems.

According to a first aspect of the present invention, there is provided a partial discharge diagnosing system for diagnosing a partial discharge produced in a gas-insulated apparatus comprising: a partial discharge signal detector for detecting a partial discharge signal representing a partial discharge produced by the gas-insulated apparatus; a signal analyzer for receiving the partial discharge signal detected by the partial discharge detector and analyzing the partial discharge signal; a diagnostic unit for determining a cause of the partial discharge on the basis of the results of analysis made by the signal analyzer, provided with a diagnostic means for multiple conditional branching; and a display unit for displaying results of diagnosis; wherein the diagnostic means of the diagnostic unit makes conditional branching to one of a plurality of second diagnostic means according to result of diagnosis made by a first diagnostic means, and obtains a result of diagnosis made by the second diagnostic means.

In the diagnostic system according to the present invention, the diagnostic unit is provided with a diagnostic means for examining a frequency spectrum of the partial discharge signal.

In the partial discharge diagnosing system according to the present invention, the frequency spectrum shows discrete values in each frequency divisions obtained by dividing the frequency band at predetermined intervals.

In the partial discharge diagnosing system according to the present invention, the diagnostic unit is provided with a diagnostic means for diagnosing feature values of a frequency spectrum of the partial discharge signal.

In the partial discharge diagnosing system according to the present invention, the diagnostic unit is provided with a diagnostic means for diagnosing periodic component signals synchronous with a phase of a system frequency.

In the partial discharge diagnosing system according to the present invention, the periodic component signals synchronous with the phase of the system frequency are discrete values in divisions determined by dividing one period of the system frequency at predetermined angular intervals.

In the partial discharge diagnosing system according to the present invention, the diagnostic unit is provided with a diagnostic means for diagnosing feature values of periodic component signals synchronous with the phase of the system frequency.

In the partial discharge diagnosing system according to the present invention, the first and the second diagnostic means analyze different kinds of analytic signals, respectively.

In the partial discharge diagnosing system according to the present invention, the signal to be examined is defined as standards with a maximum value.

In the partial discharge diagnosing system according to the present invention, the diagnostic unit employs a neural network.

In the partial discharge diagnosing system, the neural network receives a signal again and carries out diagnosis again when an output of the neural network is less than 0.5.

In the partial discharge diagnosing system according to the present invention, the diagnostic unit employs a fuzzy system.

According to a second aspect of the present invention, there is provided a method of diagnosing a partial discharge produced in a gas-insulated apparatus, the method comprises the steps of: detecting a partial discharge signal representing a partial discharge and produced by the gas-insulated apparatus by a partial discharge signal detector; receiving the partial discharge signal detected by the partial discharge detector and analyzing the partial discharge signal by a signal analyzer; determining a cause of the partial discharge on the basis of results of analysis made by the signal analyzer, provided with a diagnostic means for multiple conditional branching by a diagnostic unit; and displaying results of diagnosis on a display unit; wherein the diagnostic unit is provided with diagnostic means that carries out multiple stage conditional branching, the diagnostic means makes conditional branching to one of a plurality of second diagnostic means according to result of diagnosis made by a first diagnostic means, and obtains the results of diagnosis sequentially made by the second diagnostic means, the diagnostic means executes first a diagnostic operation for discriminating the partial discharge signal detected by the partial discharge signal detector between the partial discharge signal produced in the gas-insulated apparatus and the external noise signal.

In the method of diagnosing a partial discharge produced in a gas-insulated apparatus, after it is decided that the partial discharge signal is produced in the gas-insulated apparatus, the diagnostic means carries out a diagnostic operation for deciding whether the partial discharge signal is a partial discharge signal produced in a gas included in the gas-insulated apparatus or a partial discharge signal produced in an insulator included in the gas-insulated apparatus.

BRIEF DESCRIPTION OF THE DRAWINGS

FIG. 3 is a diagram of a neural network which can be used by the partial discharge diagnosing system shown in FIG. 1;

DESCRIPTION OF THE PREFERRED EMBODIMENTS

Figure 1:
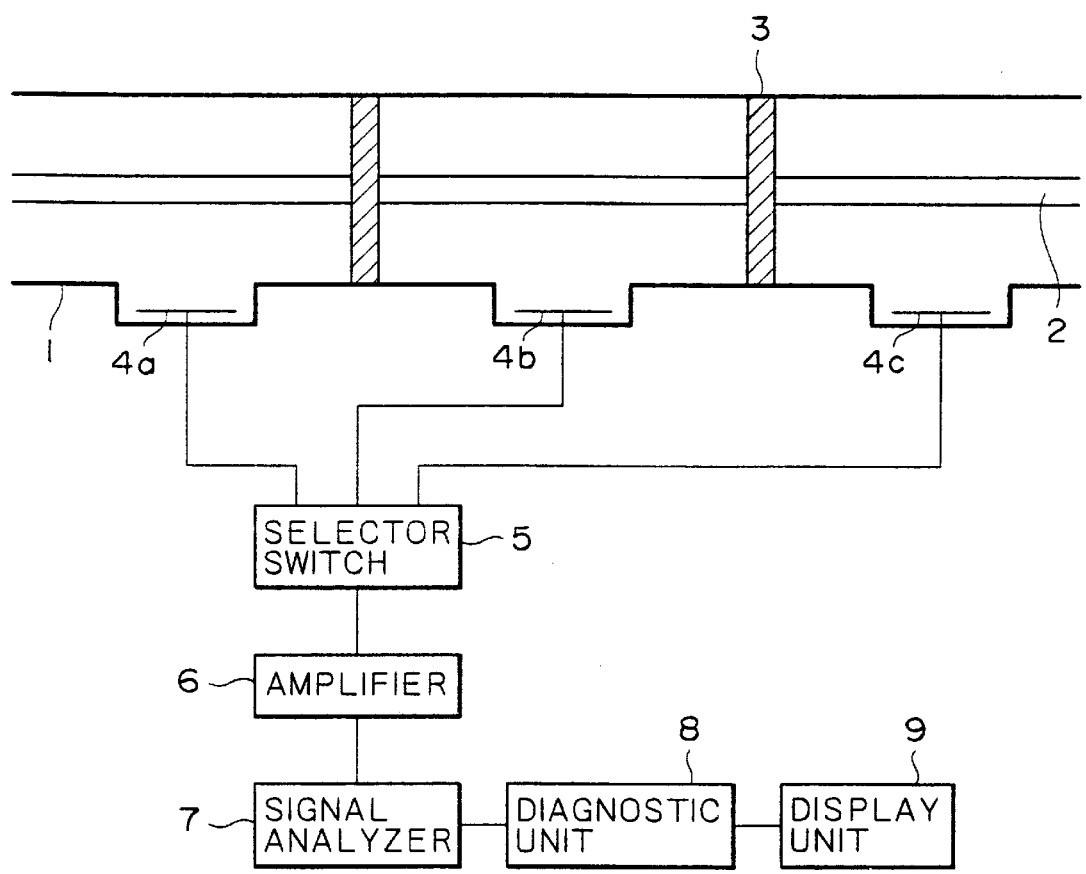
FIG. 1 is a block diagram of a partial discharge diagnosing system in a preferred embodiment according to the present invention for diagnosing a partial discharge produced in a gas-insulated apparatus.
Figure 2:
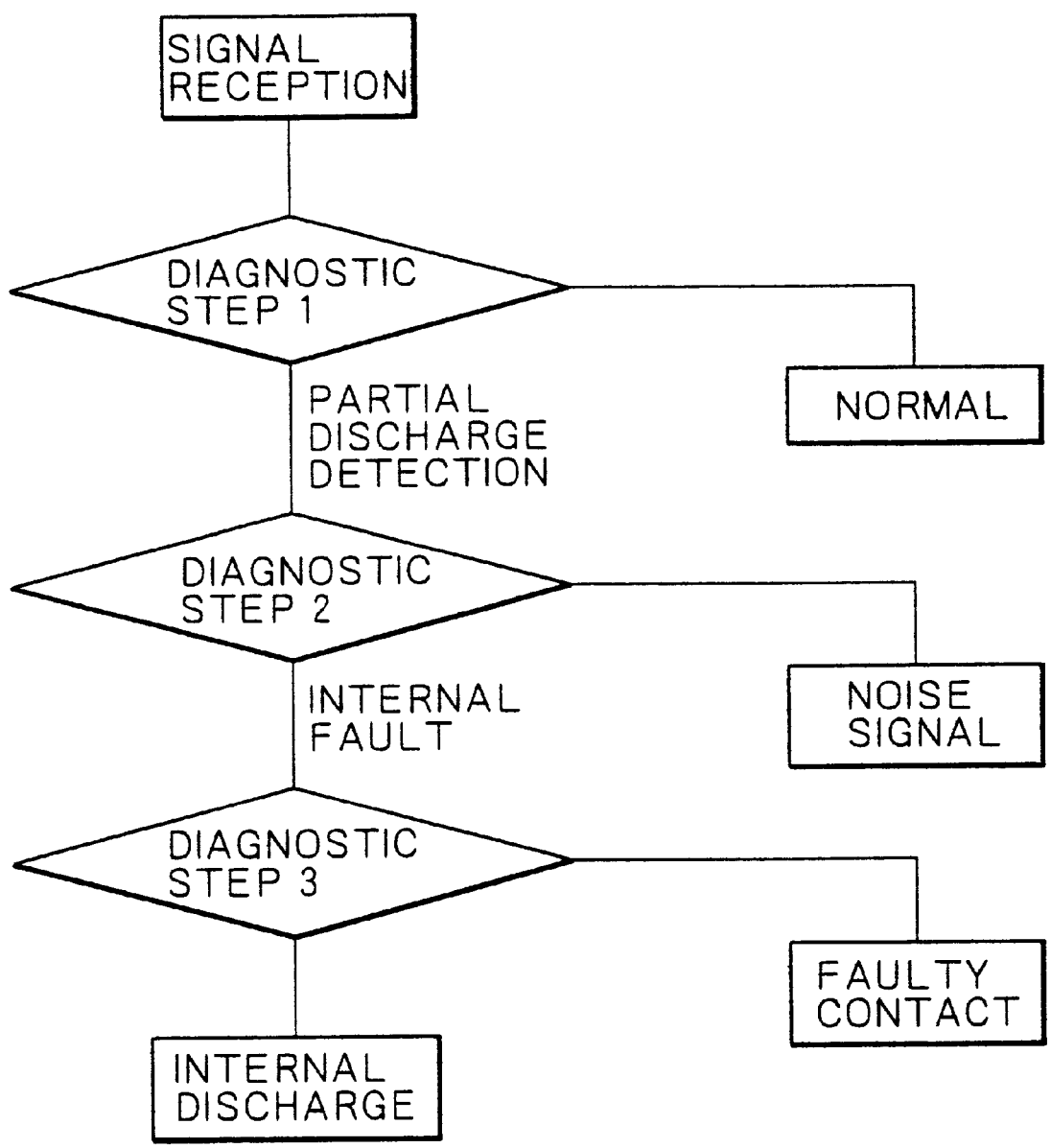
FIG. 2 is a flowchart of a diagnostic procedure including conditional branching steps to be carried out by the partial discharge diagnosing system shown in FIG. 1.

A preferred embodiment of the present invention will be described with reference to FIGS. 1 and 2. FIG. 1 is a block diagram of a partial discharge diagnosing system in a preferred embodiment according to the present invention for diagnosing a partial discharge produced in a gas-insulated apparatus and FIG. 2 is a flowchart of a diagnostic procedure using conditional branching to be carried out by the partial discharge diagnosing system shown in FIG. 1.

Referring to FIG. 1 there are shown a grounded metal container 1 included in a gas-insulated apparatus, a high-tension conductor 2, insulating spacers 3 holding the high-tension conductor 2, and partial discharge signal detectors 4a, 4b and 4c for detecting electromagnetic waves generated along with a partial discharge, a broad-band selector switch 5 for selecting one of the partial discharge signal detectors 4a, 4b and 4c, an amplifier 6, a signal analyzer 7, such as a spectrum analyzer for frequency analysis or a FFT (fast Fourier transform) analyzer for analyzing signals provided by a digital storage scope, a diagnostic unit 8 composed of such as a personal computer for diagnosing causes of the partial discharge and noise types, and a display unit 9 for displaying results of diagnosis. The partial discharge signal detectors 4a, 4b and 4c may be used as detecting antennas or internal electrodes included in the gas-insulated apparatus.

A detection signal provided by the partial discharge signal detector is transferred through the broad-band selector switch 5 and the amplifier 6 to the signal analyzer 7. The signal analyzer 7 processes the detection signal for signal analysis, such as frequency analysis. The diagnostic unit 8 receives data from the signal analyzer 7 and carries out a diagnostic procedure to determine the cause of a partial discharge and the type of noise. Results of diagnosis are displayed on the display unit 9.

With such a configuration, the partial discharge diagnosing system is able to accomplish the diagnosis in a very short time and to achieve the diagnosis of abnormal conditions occurred in the gas-insulated apparatus through automatic monitoring.

A diagnostic procedure to be carried out by the diagnostic unit 8 will be described with reference to FIG. 2.

The signal analyzer 7, such as a spectrum analyzer, analyzes a signal received from the partial discharge detectors 4a, 4b and 4c incorporated into the gas-insulated apparatus. A partial discharge is diagnosed by subjecting the analyzed partial discharge signal to diagnostic steps 1 to 3 for conditional branching.

In diagnostic step 1, data of an analyzed background noise signal (analyzed BGN signal) representing background noise generated in a state where any partial discharge is not produced is prepared beforehand. Then, the data of the analyzed BGN signal is compared with data obtained by analyzing a partial discharge signal to decide whether or not any partial discharge has been produced. For example, when the analyzed partial discharge data is greater than the analyzed BGN data, it is decided that a partial discharge has been produced. If it is decided in the diagnostic step 1 that a partial discharge has been produced, the diagnostic step 2 is executed. If it is found that any partial discharge has not been produced and the gas-insulated apparatus is operating normally, information is displayed to that effect on the display unit.

In the diagnostic step 2, a diagnosis is made to decide whether the detected partial discharge signal has been induced by an internal cause or by an external cause. If it is decided that the partial discharge signal has been produced due to an internal cause, the diagnostic step 3 is executed. If it is decided that the partial discharge signal has been produced due to an external cause, the information is displayed to the effect that the partial discharge signal is caused by external noise on the display unit.

In the diagnostic step 3, a diagnosis is made to decide whether the detected partial discharge signal represents a partial discharge that occurred in the gas-insulated apparatus or a partial discharge caused by the faulty contact of a shield or the like. If it is decided that the partial discharge signal represents a partial discharge that occurred in the gas-insulated apparatus, information is displayed to the effect that the partial discharge is an internal discharge. If it is decided that the partial discharge signal represents a discharge caused by faulty contact, information is displayed to the effect that the partial discharge is caused by faulty contact.

Thus, the partial discharge signal is subjected to multiple conditional branching, to thereby achieve accurate diagnosis.

FIG. 3 shows a neural network that can be used in the diagnostic unit.

As shown in FIG. 3, the neural network is of a three-layer structure consisting of an input layer 11, an intermediate layer 12 and an output layer 13.

Input data x1 to xm are given to the input layer 11. The input data x1 to xm may be the respective signal intensities of each one of frequency bands in a frequency spectrum or the respective signal intensities of bands obtained by dividing one period of a system frequency at predetermined angular intervals.

Results of diagnosis are provided on the output layer 13. Diagnosis can be made on the basis of output data $y_1$ and $Y_2$ provided in the output layer 13.

In the neural network shown in FIG. 3, the output layer 13 has a small number of units to achieve quick diagnosis through a small number of branching operations; that is, an accurate decision can quickly be made by using about two branching conditions to simplify the structure of the neural network for individual diagnosis. Learning time can greatly be curtailed and learning can easily be converged.

The reduction in the number of units of the output layer brings about the reduction of the number of units of the intermediate layer 12, and hence the neural network with number of the units of the entire network reduced can be obtained.

Figure 4:
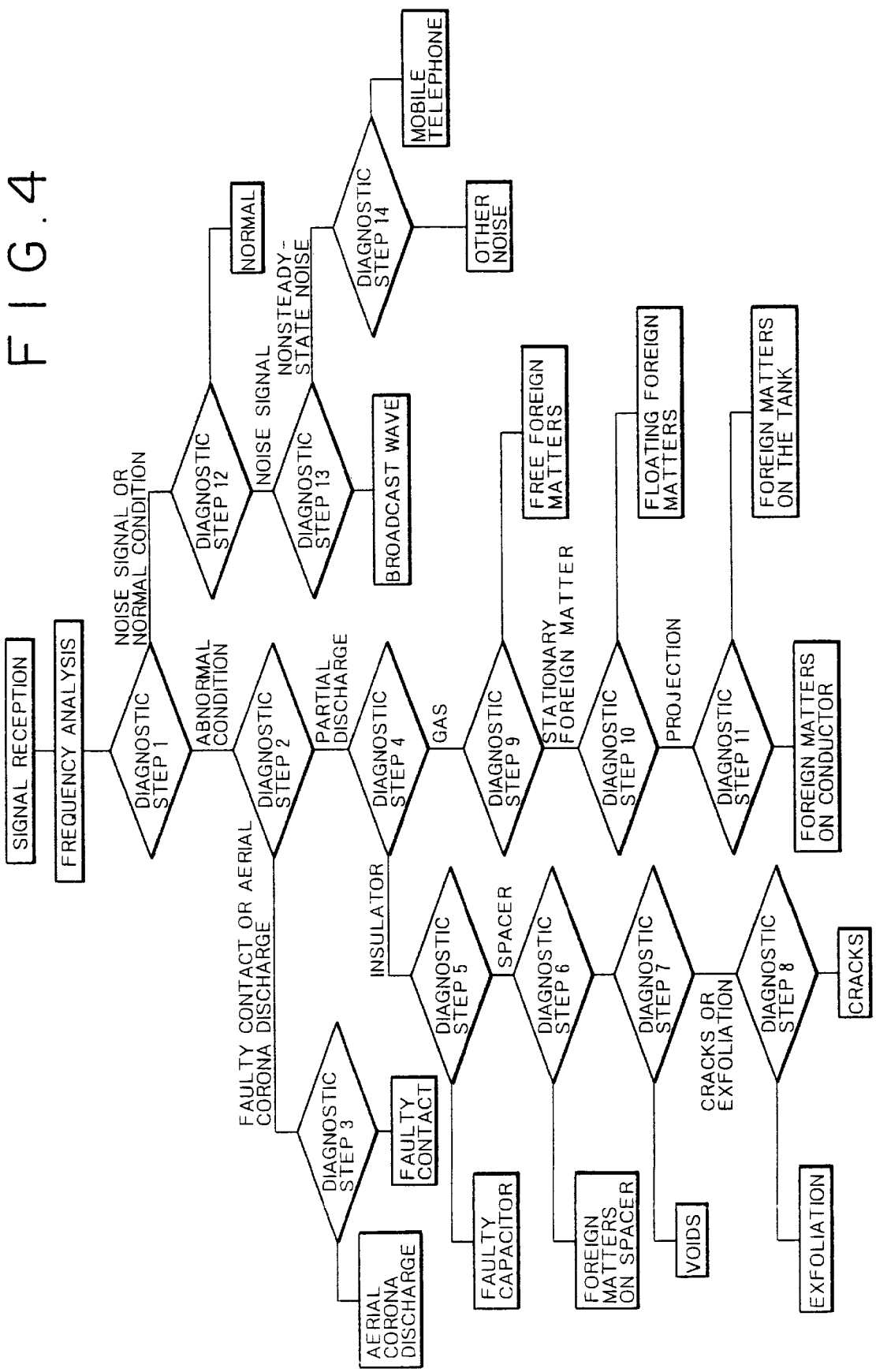
FIG. 4 is a flowchart of another diagnostic procedure to be carried out by the partial discharge diagnosing system shown in FIG. 1.

FIG. 4 is a flowchart of another diagnostic procedure including conditional branching steps to be carried out by the partial discharge diagnosing system shown in FIG. 1.

A signal received from the partial discharge detector 4 incorporated into the gas-insulated apparatus is analyzed by the signal analyzer, such as a spectrum analyzer. A partial discharge signal is analyzed by diagnostic steps 1 to 14 for conditional branching.

Data of an analyzed background noise signal (analyzed BGN signal) is prepared beforehand. In the diagnostic step 1, the analyzed BGN data is compared with data obtained by analyzing a partial discharge signal to decide whether or not any partial discharge has been produced. For example, when the analyzed partial discharge data is greater than the analyzed BGN data, it is decided that a partial discharge has been produced. If it is decided in the diagnostic step 1 that a partial discharge has been produced, the diagnostic step 2 is executed. If it is found that any partial discharge has not been produced and the gas-insulated apparatus is operating normally, or if not the partial discharge, but noise has been generated, information is displayed to the effect that the gas-insulated apparatus is normal on the display unit.

In the diagnostic step 2, a diagnosis is made to decide whether the detected partial discharge signal is the partial discharge signal produced in the gas-insulated apparatus, or the signal induced by noise due to the faulty contact of a shield or the like, or the signal induced due to an aerial corona discharge produced outside a tank of the gas-insulated apparatus. If it is decided that the partial discharge signal has been produced by an aerial corona discharge or the like, the diagnostic step 3 is executed. If it is decided that the partial discharge signal has been generated due to a partial discharge occurred in the gas-insulated apparatus, the diagnostic step 4 is executed.

In the diagnostic step 3, diagnosis is made to decide whether the detected partial discharge signal represents a condition created by the faulty contact of the shield or the like, or a condition created by an aerial corona discharge produced outside the tank of the gas-insulated apparatus.

In the diagnostic step 4, diagnosis is made to decide whether the detected partial discharge signal has been produced due to an abnormal condition due to the insulating gas system or an abnormal condition due to the insulating system. If it is decided that the partial discharge signal represents an abnormal condition created by the insulating gas system, the diagnostic step 9 is executed. If it is decided that the partial discharge signal represents an abnormal condition created by the insulating system, the diagnostic step 5 is executed.

In the diagnostic step 5, diagnosis is made to decide whether the detected partial discharge signal represents a condition created by a defect in a spacer or a condition created by a defect in a built-in capacitor. When it is decided that the partial discharge signal represents the condition created by a defect in the spacer, the diagnostic step 6 is executed.

In the diagnostic step 6, diagnosis is made to decide whether or not the detected partial discharge signal represents a condition created by foreign matters on the spacer. If it is decided that the partial discharge signal represents a condition created by a cause other than foreign matters on the spacer, the diagnostic step 7 is executed.

In the diagnostic step 7, diagnosis is made to decide whether the partial discharge signal represents a condition created by cracks in the insulator, a condition created by exfoliation in the insulator or a condition created by voids in the insulator.

In the diagnostic step 8, diagnosis is made to decide whether the detected partial discharge signal represents a condition created by cracks in the insulator or a condition created by exfoliation in the insulator.

In the diagnostic step 9, diagnosis is made to decide whether the detected partial discharge signal represents a condition created by stationary foreign matters contained in the insulating gas or a condition created by metallic foreign matters floating in the insulating gas. If it is decided that the partial discharge signal represents a condition created by stationary foreign matters, the diagnostic step 10 is executed.

In the diagnostic step 10, diagnosis is made to decide whether the detected partial discharge signal represents a condition created by a projection formed in the insulating gas or a condition created by metallic foreign matters floating in the insulating gas. If it is decided that the partial discharge signal represents a condition created by a projection formed in the insulating gas or metallic foreign matters floating in the insulating gas, the diagnostic step 11 is executed.

In the diagnostic step 11, diagnosis is made to decide whether the detected partial discharge signal represents a condition created by foreign matters lying on the conductor.

In the diagnostic step 12, diagnosis is made to decide whether or not the detected partial discharge signal was generated by external noise. If it is decided that the partial discharge signal was generated by external noise, the diagnostic step 13 is executed.

In the diagnostic step 13, diagnosis is made to decide whether the detected partial discharge signal represents a broadcast wave or nonsteady-state noise. If it is decided that the partial discharge signal is a nonsteady-state noise, the diagnostic step 14 is executed.

In the diagnostic step 14, diagnosis is made to decide whether the detected partial discharge signal is a signal generated by a mobile telephone or other noise signal.

The causes of abnormal conditions are determined through conditional branching in the diagnostic steps 1 to 14. Since each diagnostic step has two branches, the diagnostic operation is simple and accurate diagnosis can be achieved.

Diagnosing accuracy is improved by providing conditional branching for examining characteristic patterns of signals in early diagnostic steps. That is, the noise signal whose characteristic is greatly different from the partial discharge signal is examined in the diagnostic step 1, the signal produced by faulty contact or aerial corona discharge is examined in the diagnostic step 2, and the diagnosis to decide whether the signal is produced by an abnormal condition in the spacer or by an abnormal condition in the built-in capacitor is executed in the diagnostic step 5. Accordingly, the final accuracy of the diagnosis of the partial discharge signal is improved by executing conditional branching or significant causes in the initial stage of diagnosis.

A method of improving diagnosing accuracy of the neural network by rediagnosis will be described hereinafter.

Figure 5:
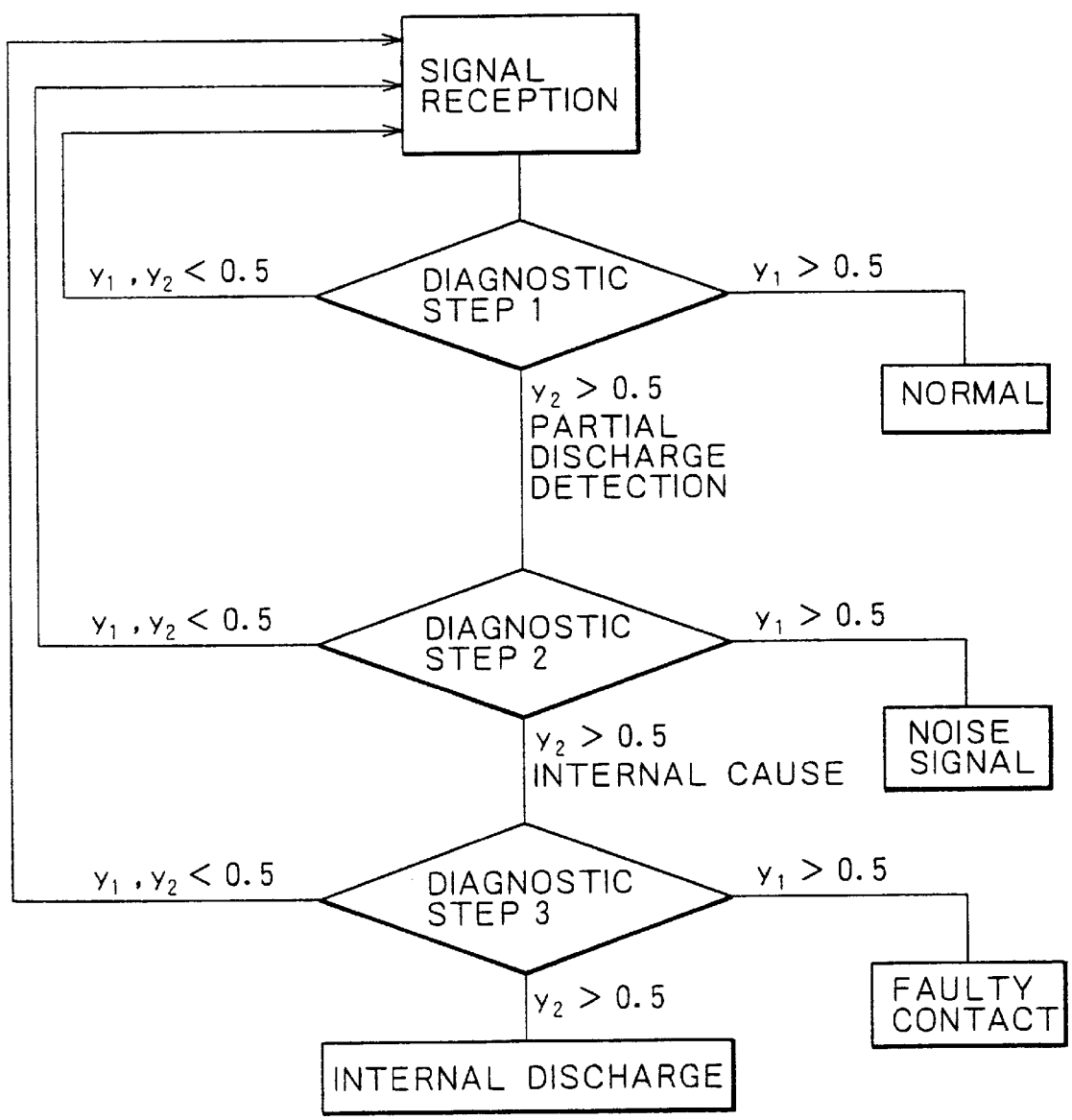
FIG. 5 is a flowchart of a diagnostic procedure to be carried out by a neural network for rediagnosis.

FIG. 5 is a flowchart of a diagnostic procedure to be carried out by the neural network for rediagnosis.

In FIG. 5, operations for conditional branching to be executed in diagnostic steps 1 to 3 and the following conditional branching are the same as those shown in FIG. 2 and hence the description thereof will be omitted.

Data of analyzed background noise signal (analyzed BGN signal) representing background noise is prepared beforehand as data of a partial discharge signal. In the diagnostic step 1, the data of analyzed BGN signal is compared with data of an actually received partial discharge signal to decide whether or not any partial discharge has been produced. For example, when the data of the analyzed partial discharge signal is greater than the data of the analyzed BGN signal, it is decided that a partial discharge has been produced.

In the diagnostic step 1 to be executed by the neural network, the neural network needs to decide that its output is true, only when an output provided on one of its output units is greater than a predetermined value. In other words, when an output value yn provided on the output unit in the diagnostic step 1 satisfies yn>0.5, it is decided that yn is true. In the diagnostic step 1 of FIG. 5, it is decided that the condition is normal when y1>0.5 and a partial discharge signal has been detected when y2>0.5, followed by the execution of diagnostic step 2. When y1<0.5 and y2<0.5, it is decided that definite diagnosis is impossible and a signal is received again for rediagnosis.

Similarly, it is decided in diagnostic steps 2 and 3 that definite diagnosis is impossible and a signal is received again for rediagnosis when $y_1$<0.5 and $y_2$<0.5.

Conventionally, a decision is made on the basis of a criterion that a maximum value among the outputs from the output unit is true, so that a decision is made even if the outputs on the output unit are nearly zero, or, even if the input date is greatly different from the data obtained by learning. However, as mentioned above, it is decided that a definite diagnosis is impossible when $Y_1$<0.5 and $Y_2$<0.5 and a signal is received again for rediagnosis to avoid making a wrong decision.

The analyzed data for diagnosis will be described. The analyzed data for diagnosis can be provided by the signal analyzer 7.

Figure 6:
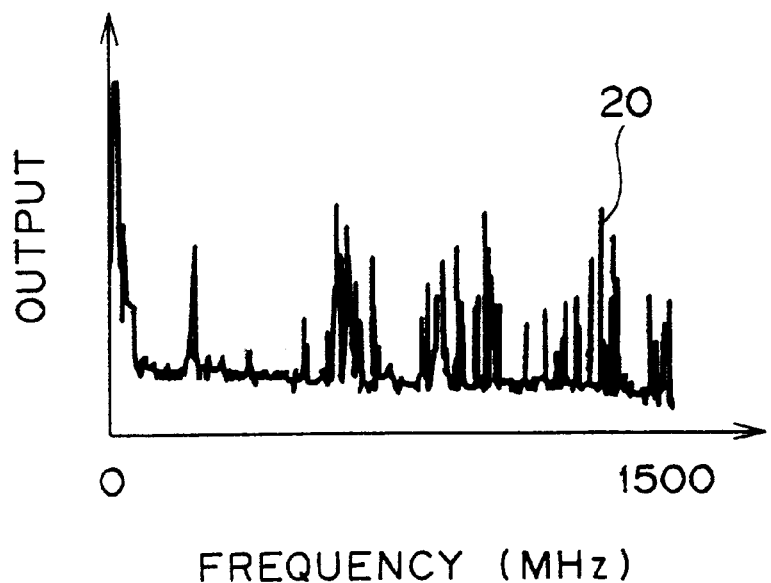
FIG. 6 is a graph of a frequency spectrum of a partial discharge signal in a preferred embodiment according to the present invention.

FIG. 6 shows a frequency spectrum produced by analyzing the partial discharge signal produced in the gas-insulated apparatus by the spectrum analyzer. In FIG. 6, frequency data measured on the horizontal axis appear at several hundreds points. Therefore, it will take much time for learning and it is possible that learning does not converge if all the frequency data is given to the neural network for diagnosis.

Figure 7:
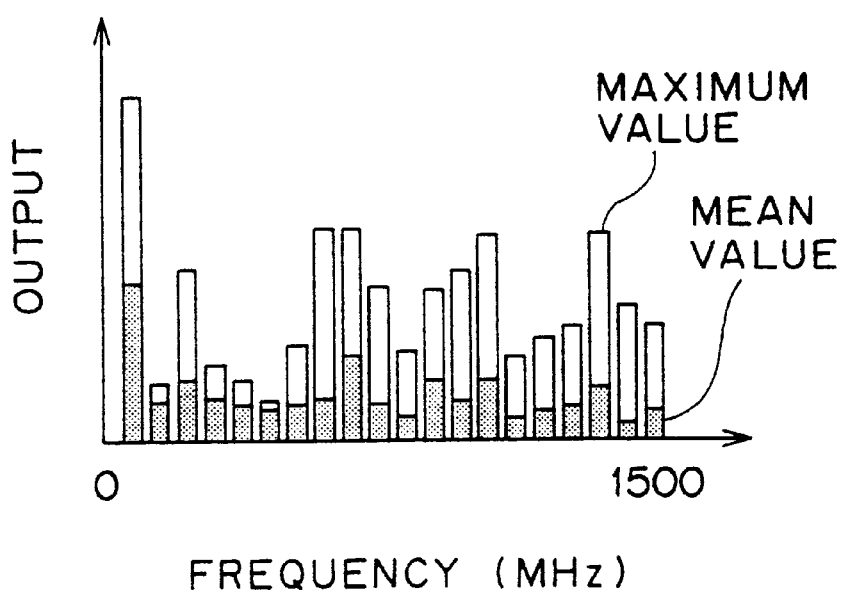
FIG. 7 is a graph obtained by superposing a bar graph of the mean signal output in frequency divisions determined by dividing the frequency range of the frequency spectrum shown in FIG. 6 at equal intervals and a bar graph of the maximum signal output in the frequency divisions.

FIG. 7 is a graph obtained by dividing the frequency band of frequency spectrum shown in FIG. 6, 0 to 1500 MHz at each 75 MHz into 20 divisions, and superposing a bar graph of the mean value and the maximum value in each frequency divisions. The amount of the analyzed data can be reduced without changing the pattern of the frequency spectrum by producing the analyzed data by thus dividing the frequency range into frequency divisions and calculating the mean value and the maximum value of the frequency divisions. The difference between signals due to variation of the partial discharge phenomenon can be reduced by reducing the amount of the data and accurate diagnosis can be achieved.

Figure 8:
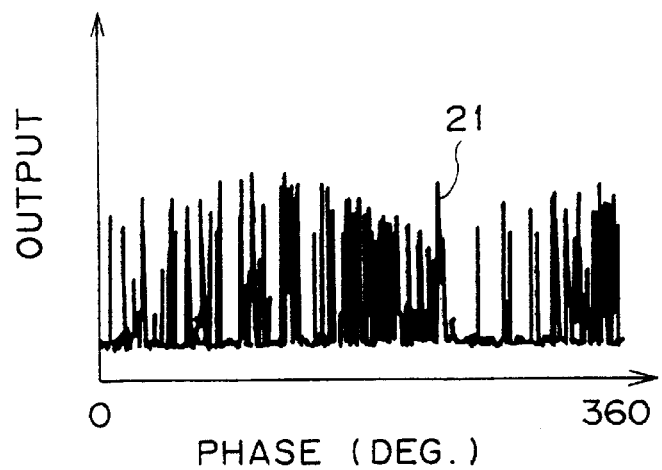
FIG. 8 is a graph showing a pattern of the signal output of a periodic component synchronous with the phase of a system frequency.

FIG. 8 is a graph showing a pattern of the signal intensity of a periodic component synchronous with the phase of a system frequency. The partial discharge phenomenon that occurs in the gas-insulated apparatus is dependent on the amplitude of an applied AC voltage. Therefore, each partial discharge has phase characteristics specific to the causes of the partial discharges. Therefore, the partial discharge signal can be discriminated from the noise signal and causes of the partial discharge signal can be determined by analyzing the signal intensity of the periodic component synchronous with the phase of the system frequency for each phase.

Figure 9:
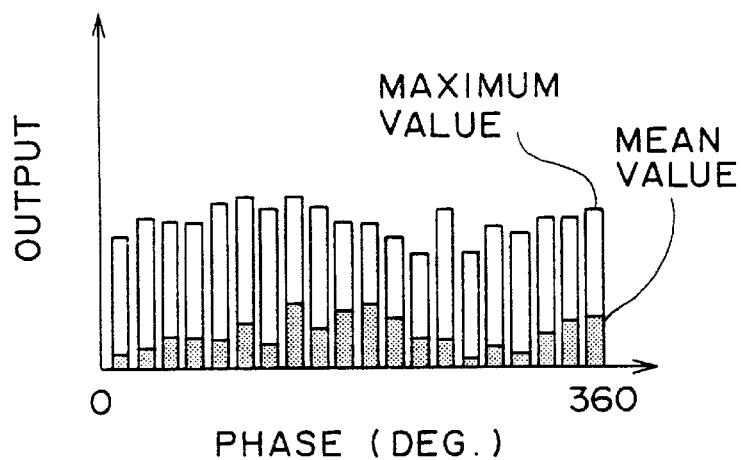
FIG. 9 is a graph obtained by superposing a bar graph of the mean signal output of phase divisions determined by dividing the pattern of the signal output shown in FIG. 8 and a bar graph of the maximum signal intensities in the phase divisions.

FIG. 9 is a graph obtained by dividing one period (0° to 360°) of an applied ac voltage in the graph of signal intensities of periodic components synchronous with the phase of the system frequency shown in FIG. 8 at each 18° into 20 divisions, and superposing a bar graph of the mean value and the maximum value in each divisions. The amount of the analyzed data can be reduced without changing the pattern of the signal intensities of the periodic components synchronous with the phase of the system frequency by calculating the mean value and the maximum value of the phase divisions by thus dividing the phase into phase divisions. The difference between signals due to variation of the partial discharge phenomenon can be reduced by reducing the amount of the data and accurate diagnosis can be achieved.

Figure 10:
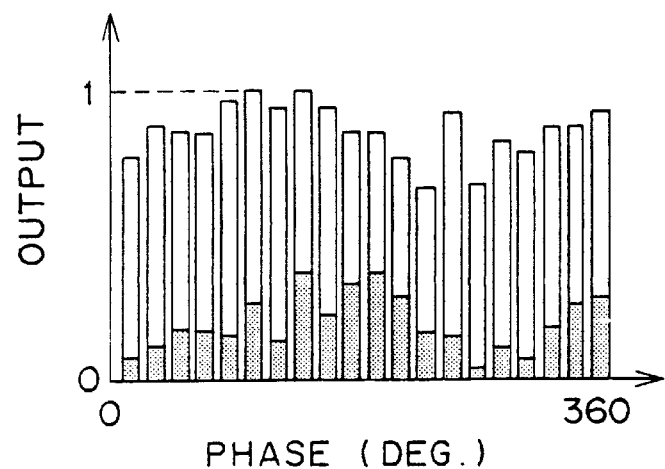
FIG. 10 is a bar graph obtained by defining a pattern of signal output of periodic components synchronous with the phase of the system frequency as standards in a preferred embodiment according to the present invention.

FIG. 10 is a bar graph obtained by defining a pattern of signal intensities of periodic components synchronous with the phase of the system frequency as standards with a maximum signal intensity. In addition to a pattern of the signal intensity of the periodic components, the frequency pattern and a feature pattern can be defined as standards.

There is a possibility of deciding that partial discharge signals indicating partial discharges caused by the same cause are different partial discharge signals when the partial discharges differ from each other in intensity or distance between a position where the partial discharge occurred and a position where the partial discharge is measured.

When signal intensity patterns are defined as standards with their maximum values as shown in FIG. 10 to eliminate the difference between the signals due to difference in signal attenuation, signal intensity patterns of partial discharge signals indicating partial discharges caused by the same cause are not taken to be those indicating partial discharges caused by different causes, respectively.

Figure 11:
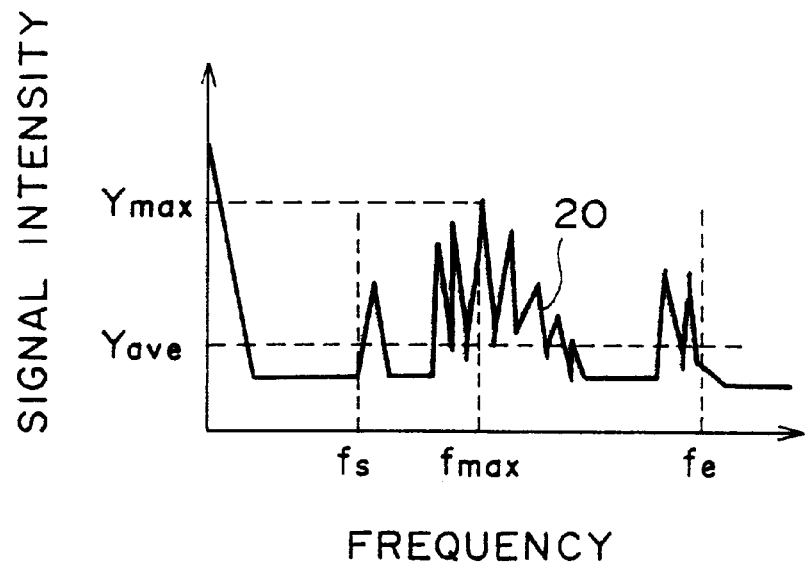
FIG. 11 is a graph showing feature values extracted from a frequency spectrum obtained by measuring a partial discharge signal by a spectrum analyzer in a preferred embodiment according to the present invention.

FIG. 11 is a graph showing feature values extracted from a frequency spectrum obtained by measuring a partial discharge signal by a spectrum analyzer. In FIG. 11, Ymax is the value of the maximum signal intensity, Yave is the value of the average signal intensity, fmax is a frequency corresponding to the maximum signal intensity Ymax, fs and fe are frequencies in a low-frequency range and a high-frequency range in a spectrum produced on a high-frequency side, respectively. These feature values are used as data for analysis by the signal analyzer.

Figure 12:
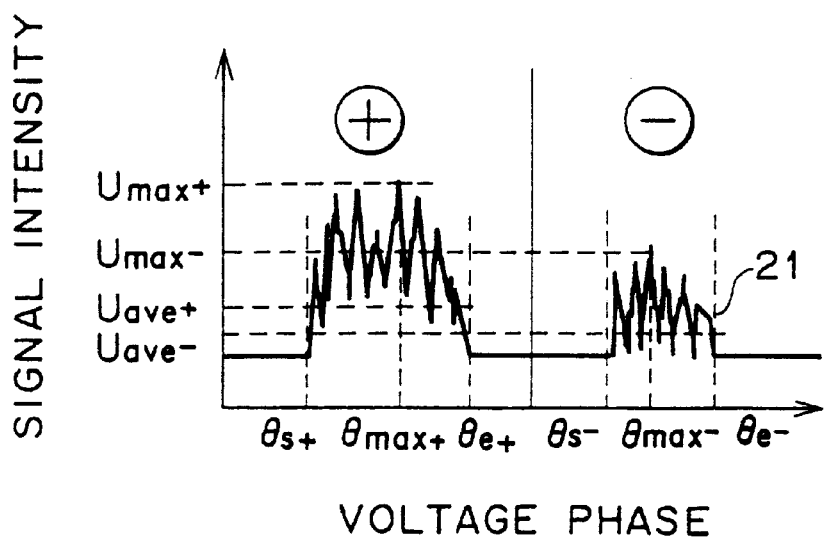
FIG. 12 is a graph showing feature values extracted from a signal intensity pattern of periodic components synchronous with the phase of a system frequency in a preferred embodiment according to the present invention.

FIG. 12 is a graph showing feature values extracted from a signal intensity pattern of periodic components synchronous with the phase of a system frequency. In FIG. 12, Umax+ is a maximum value of signal intensity in a positive half wave, Umax− is a maximum value of signal intensity in a negative half wave, Uave+ is the average value of signal intensity in the positive half wave, Uave− is the average value of signal intensity of the negative half wave, θs+ and θs− are the phase angles of the leading edges of the positive half wave signal waveform and the negative half wave signal, respectively, θe+ and θe− are the phase angles of the trailing edges of the positive half wave signal waveform and the negative half wave signal, respectively, and θmax+ and θmax− are phase angles corresponding to the maximum signal intensities in the positive half wave signal waveform and the negative half wave signal, respectively. These feature values can be used as data for analysis by the signal analyzer.

FIGS. 11 and 12 roughly show the signal intensity patterns of a partial discharge in the range of 0 to 1500 MHz produced when a fixed foreign matter, such as a projection, lies on the high-tension conductor of the gas-insulated apparatus. In FIG. 12, the partial discharge signal is concentrated on regions around peaks in the positive and the negative half wave. The pattern shown in FIG. 12 assumes the typical features of a partial discharge signal indicating a partial discharge caused by a defect in the gas system.

The feature values shown in FIGS. 11 and 12 are more conspicuous for detecting a fixed foreign matter, such as a projection on the high-tension conductor of the gas-insulated apparatus than the patterns of frequency spectrum or the signal intensity of the periodic components synchronous with the phase of the system frequency. The use of those feature values improves the accuracy of diagnosis.

In the foregoing description, the feature values are extracted from parameters indicating the intensity, the frequency and the phase of the partial discharge signal. Other feature values representing the shape of the partial discharge signal pattern, such as the skewness and the sharpness of the partial discharge signal pattern, or coefficient of correlation in the positive and the negative half wave may be used as data for analysis.

The feature values of the partial discharge signal include those specific to the cause of the partial discharge and those dependent on the measuring conditions, such as applied voltage, ambient conditions including the pressure of the gas. For example, the number of times to cause the partial discharge, the intensity and the starting phase of a partial discharge caused by a projection formed on the high-tension conductor changes as the applied voltage rises. On the other hand, the voltage phase of the maximum discharge intensity and the average phase in which the discharge is produced are scarcely dependent on the applied voltage. Accordingly, the accuracy of diagnosis can be improved by using feature values independent of measuring conditions as data for analysis.

A diagnostic system can be constructed by using the feature values thus extracted as input data for a fuzzy system or a neural network.

Figure 13:
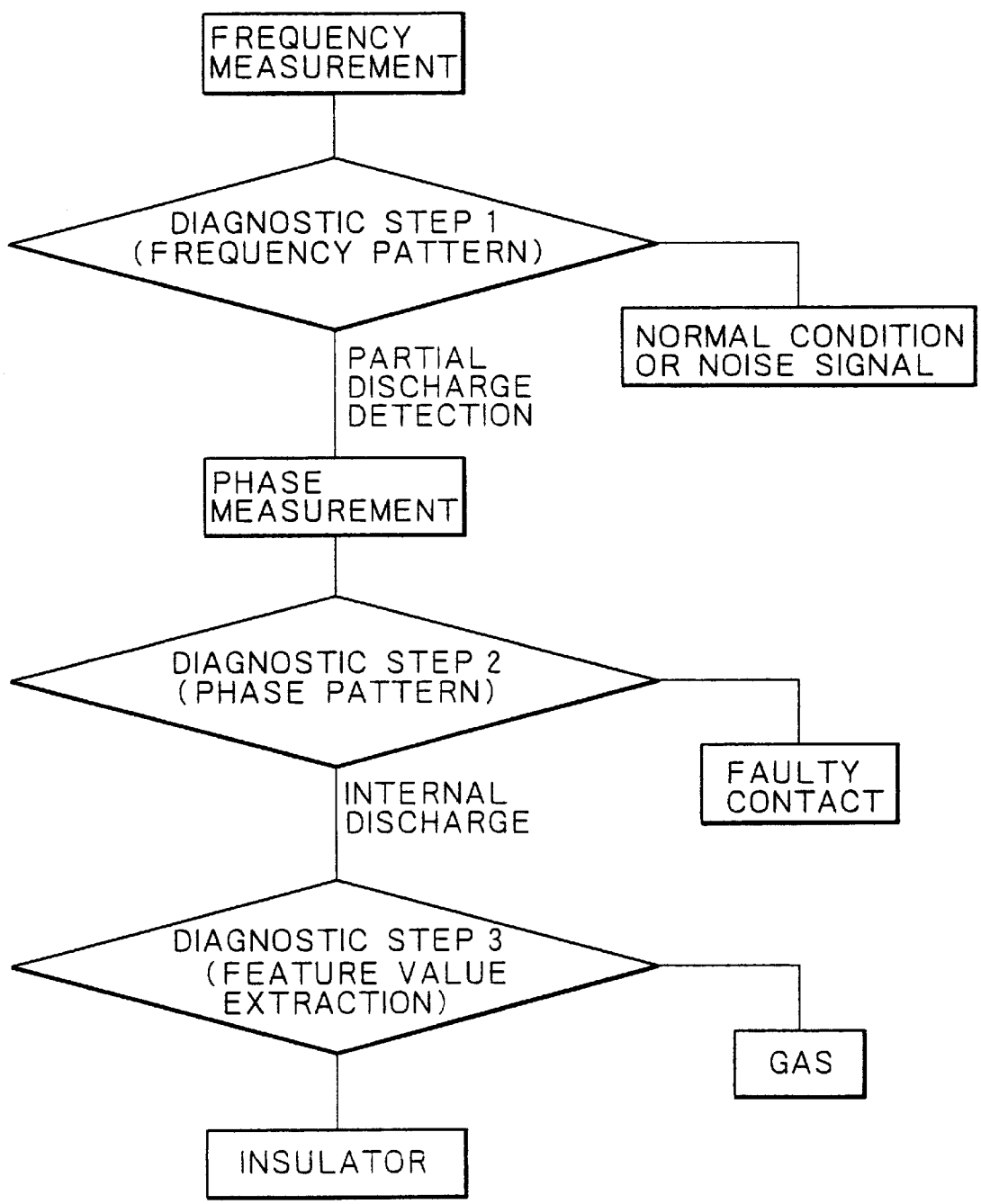
FIG. 13 is a flowchart of another diagnostic procedure to be carried out by the preferred embodiment according to the present invention.

FIG. 13 is a flowchart of another diagnostic procedure to be carried out by the partial discharge diagnosing system.

Diagnosis is carried out in a diagnostic step 1 by using frequency analyzing data obtained by analyzing a frequency spectrum (frequency pattern). Background noise data (BGN data) representing background noise is prepared beforehand. In the diagnostic step 1, the BGN data is compared with an partial discharge data obtained by analyzing a partial discharge signal to decide whether or not any partial discharge has been produced. For example, when the partial discharge data is greater than the BGN data, it is decided that a partial discharge has been produced. If it is decided in the diagnostic step 1 that a partial discharge has been produced, a diagnostic step 2 is executed. If any partial discharge has not been produced and the gas-insulated apparatus is operating normally, information is displayed to that effect on the display unit.

In the diagnostic step 2, diagnosis is made by using data obtained by analyzing the signal intensity pattern (phase pattern) of periodic components synchronous with the phase of a system frequency to decide whether the partial discharge signal indicates a condition created by an internal cause or an external cause. If it is decided that the partial discharge signal indicates a condition created by an internal cause, a diagnostic step 3 is executed. If it is decided that the partial discharge signal indicates a condition created by an external cause, information is displayed to the effect that the partial discharge signal is caused by external noise on the display unit. When analyzing the phase pattern, it is desirable to use a frequency at which a maximum output is obtained in a frequency range above 300 MHz because frequencies 300 MHz or less are susceptible to the effect of aerial corona discharge and broadcast waves. The accuracy of diagnosis can be improved by using phase patterns of a plurality of frequencies from which second and third peaks can be obtained in addition to the phase pattern of a single frequency.

In the diagnostic step 3, diagnosis is made by using feature values extracted from at least one or more of the frequency pattern and the phase pattern to decide whether the partial discharge signal represents a partial discharge that occurred in the gas-insulated apparatus or a partial discharge caused by the faulty contact of a shield or the like. If it is decided in the diagnostic step 3 that the partial discharge signal represents a partial discharge that occurred in the gas-insulated apparatus, information is displayed to the effect that the partial discharge is an internal discharge on the display unit. If it is decided that the partial discharge signal represents a discharge caused by faulty contact, information is displayed to the effect that the partial discharge is caused by faulty contact.

Although the diagnostic procedure has been described on an assumption that the diagnostic steps 1 to 3 use a neural network, it is desirable to use the most accurate diagnostic methods for each diagnostic step. For example, the neural network may be used in the diagnostic steps 1 and 2, and a fuzzy system may be used in the diagnostic step 3. If the diagnostic procedure uses such different diagnostic methods, the different diagnostic steps shall use different algorithms, and hence the partial discharge diagnosing system inevitably has a complicated configuration. However, highly-accurate diagnosis can be achieved because the diagnostic steps use accurate diagnostic methods, respectively.

As apparent from the foregoing description, according to the present invention, accurate diagnosis can be achieved by detecting the partial discharge signal and subjecting the partial discharge signal to multiple conditional branching for diagnosis.

The partial discharge diagnosing system which is simple in configuration and capable of achieving accurate diagnosis by using various patterns obtained by analyzing the partial discharge signal and the partial discharge diagnosing method can be achieved.

While a preferred embodiment of the present invention has been described using specific terms, such description is for illustrative purpose only, and it is to be understood that changes and variations may be made without departing from the spirit or scope of the following claims.

What is claimed is:

1. A partial discharge diagnosing system for diagnosing a partial discharge produced in a gas-insulated apparatus, said partial discharge diagnosing system comprising:
   a partial discharge signal detector for detecting a partial discharge signal representing a partial discharge produced by the gas-insulated apparatus;
   a signal analyzer for receiving the partial discharge signal detected by the partial discharge signal detector and analyzing the partial discharge signal;
   a diagnostic unit for determining a cause of said partial discharge on the basis of results of analysis made by said signal analyzer, provided with a diagnostic means for multiple conditional branching; and
   a display unit for displaying said results of diagnosis; wherein a diagnostic means of said diagnostic unit makes conditional branching to one of a plurality of second diagnostic means according to result of diagnosis made by a first diagnostic device, and obtains a result of diagnosis made by the second diagnostic means.

2. The partial discharge diagnosing system according to claim 1, wherein said diagnostic unit examines a frequency spectrum of said partial discharge signal.

3. The partial discharge diagnosing system according to claim 2, wherein said frequency spectrum shows discrete values in frequency divisions of a predetermined frequency band.

4. The partial discharge diagnosing system according to claim 1, wherein said diagnostic means examines periodic component signals synchronous with a phase of a system frequency.

5. The partial discharge diagnosing system according to claim 4, wherein said periodic component signals synchronous with the phase of the system frequency are discrete values in divisions determined by dividing one period of the system frequency at predetermined angular intervals.

6. The partial discharge diagnosing system according to claim 4, wherein said diagnostic means examines feature values of periodic component signals synchronous with the phase of the system frequency.

7. The partial discharge diagnosing system according to claim 1, wherein said first and the second diagnostic means analyze for different signals, respectively.

8. The partial discharge diagnosing system according to claim 1, wherein said diagnostic unit employs a neural network.

9. The partial discharge diagnosing system according to claim 1, wherein said diagnostic unit employs a fuzzy system.

10. A method of diagnosing a partial discharge produced in a gas-insulated apparatus, said method comprising the steps of:
    detecting a partial discharge signal representing a partial discharge produced by the gas-insulated apparatus by a partial discharge signal detector;
    receiving said partial discharge signal detected by the partial discharge signal detector and analyzing the partial discharge signal by a signal analyzer;
    determining a cause of the partial discharge on the basis of results of analysis made by said signal analyzer; and
    displaying results of diagnosis on a display unit;
    wherein the diagnostic unit is provided with diagnostic means that carries out multiple conditional branching, said diagnostic means makes conditional branching to one of a plurality of second diagnostic means according to the result of diagnosis made by a first diagnostic means, and obtains results of diagnosis sequentially made by said second diagnostic means, said diagnostic means executes first a diagnostic operation for discriminating the partial discharge signal detected by the partial discharge signal detector between the partial discharge signal produced in said gas-insulated apparatus and external noise signal.

11. The method of diagnosing a partial discharge produced in a gas-insulated apparatus according to claim 10, wherein, when it is decided that the detected signal is produced by the gas-insulated apparatus, the diagnostic means carries out a diagnostic operation for deciding whether the partial discharge signal indicates a partial discharge produced in a gas included in the gas-insulated apparatus or a partial discharge produced in an insulator included in the gas-insulated apparatus.

12. A partial discharge diagnosing system for diagnosing a partial discharge produced in a gas-insulated apparatus, said partial discharge diagnosing system comprising:
    a partial discharge signal detector for detecting a partial discharge signal representing a partial discharge produced by the gas-insulated apparatus;
    a signal analyzer for receiving the partial discharge signal detected by the partial discharge detector and analyzing the partial discharge signal;
    a diagnostic computer that determines a cause of said partial discharge on the basis of results of analysis made by said signal analyzer, said diagnostic computer performing multiple conditional branching; and
    a display unit for displaying said results of diagnosis; wherein said diagnostic computer makes conditional branching to one of a plurality of second diagnostic steps according to a result of diagnosis made in a first diagnostic step by said diagnostic computer, and obtains a result of diagnosis made in the second diagnostic step by said diagnostic computer.

13. The partial discharge diagnosing system according to claim 12, wherein said diagnostic computer examines a frequency spectrum of said partial discharge signal.

14. The partial discharge diagnosing system according to claim 13, wherein said frequency spectrum shows discrete values in frequency divisions of a predetermined frequency band.

15. The partial discharge diagnosing system according to claim 12, wherein said diagnostic computer examines periodic component signals synchronous with a phase of a system frequency.

16. The partial discharge diagnosing system according to claim 15, wherein said periodic component signals synchronous with the phase of the system frequency are discrete values in divisions determined by dividing one period of the system frequency at predetermined angular intervals.

17. The partial discharge diagnosing system according to claim 15, wherein said diagnostic computer examines feature values of periodic component signals synchronous with the phase of the system frequency.

18. The partial discharge diagnosing system according to claim 12, wherein said diagnostic computer analyzes different kinds of analytic signals in the first and second diagnostic steps, respectively.

19. The partial discharge diagnosing system according to claim 12, wherein said diagnostic computer employs a neural network.

20. A method of diagnosing a partial discharge produced in a gas-insulated apparatus, said method comprising the steps of:

detecting a partial discharge signal representing a partial discharge produced by the gas-insulated apparatus by a partial discharge signal detector;

receiving said partial discharge signal detected by the partial discharge detector and analyzing the partial discharge signal by a signal analyzer;

determining a cause of the partial discharge on the basis of results of analysis made by said signal analyzer; and displaying results of diagnosis on a display unit; wherein a diagnostic computer performs multiple conditional branching including conditional branching to one of a plurality of second diagnostic steps performed by said diagnostic computer according to a result of diagnosis made in a first diagnostic step performed by said diagnostic computer, and obtains results of diagnosis sequentially made in said second diagnostic step, said diagnostic computer executes first a diagnostic operation for discriminating the partial discharge signal detected by the partial discharge signal detector between the partial discharge signal produced in said gas-insulated apparatus and external noise signal.

21. The method of diagnosing a partial discharge produced in a gas-insulated apparatus according to claim 20, wherein, when it is decided that the detected signal is produced by the gas-insulated apparatus, the diagnostic computer carries out a diagnostic operation for deciding whether the partial discharge signal indicates a partial discharge produced in a gas included in the gas-insulated apparatus or a partial discharge produced in an insulator included in the gas-insulated apparatus.

* * * * *